United States Patent [19]

Seiwa et al.

[11] Patent Number: 4,701,926
[45] Date of Patent: Oct. 20, 1987

[54] LASER DIODE

[75] Inventors: Yoshito Seiwa; Saburo Takamiya, both of Itami, Japan

[73] Assignee: Mitsubishi Denki Kabushiki Kaisha, Tokyo, Japan

[21] Appl. No.: 837,358

[22] Filed: Mar. 6, 1986

[30] Foreign Application Priority Data

Mar. 27, 1985 [JP] Japan .................................. 60-65715

[51] Int. Cl.$^4$ .............................................. H01S 3/19
[52] U.S. Cl. ........................................ 372/45; 372/46; 372/48; 357/17; 357/16
[58] Field of Search .................. 372/48, 46, 45, 44; 357/16, 17

[56] References Cited

U.S. PATENT DOCUMENTS 4,326,176 4/1982 Aiki et al. ............................ 372/46

OTHER PUBLICATIONS

"Channeled-Substrate Planar Structure (AlGa) as Injection Lasers"; K. Aiki et al, *Applied Physics Letter*, vol. 30, No. 12, Jun. 15, 1977, pp. 649–651.
Castrucci et al., "Bipolar/FET High Performance Circuit", *IBM Technical Disclosure Bulletin*, vol. 16, No. 8, Jan. 1974, pp. 2719–2720.
Nakazato et al., "SICOS-A High Performance Bipolar Structure for VLSI", *VLSI Symposium*, 1982, pp. 118–119.
Tang et al., "A Symmetrical Bipolar Structure", (*IBM*) (*IE DM*), 1980, pp. 58–60.

Primary Examiner—James W. Davie
Assistant Examiner—Georgia Y. Epps
Attorney, Agent, or Firm—Lowe Price LeBlanc Becker & Shur

[57] ABSTRACT

A laser diode in accordance with the present invention comprises: a substrate (11) of p-GaAs; a current constricting layer (12) of n-GaAs formed with a slit (13) over the substrate, wherein the slit is opened through the constricting layer and separates the constricting layer into two areas; a liner(s) (21) of p-GaAs formed on at least both the inner side walls of the slit; a lower clad layer (14) of p-Ga$_{0.6}$Al$_{0.4}$As formed over the constricting layer, burying the slit; an active layer (15) of p-Ga$_{0.9}$Al$_{0.1}$As which is formed over the lower clad layer and has a refractive index higher than that of the lower clad layer; and an upper clad layer of n-Ga$_{0.6}$Al$_{0.4}$As which is formed over the active layer and has a refractive index lower than that of the active layer.

8 Claims, 10 Drawing Figures

LASER DIODE

BACKGROUND OF THE INVENTION

1. Field of the Invention

This invention relates to a laser diode and more particularly to a stripe-type laser diode having an improved efficiency of the optical confinement.

2. Description of the Prior Art

A conventional stripe-type laser diode is described by K. Aiki et al. in *Applied Physics Letters,* Vol. 30, Nov. 12, 1977, pp. 649-651.

Preferring to FIG. 1, another conventional stripe-type laser diode is shown in a sectional view normal to the direction of light propagation. Formed over a main surface of a p-GaAs substrate 1 is a current constricting n-GaAs layer 2 with a slit 3 for constricting electric current within the slit 3. The slit 3 is opened through the constricting layer 2 by etching and separates the constricting layer 2 into two areas. A lower clad layer 4 of p-$Ga_{0.6}Al_{0.4}As$ is epitaxitially formed over the constricting layer 2, burying the slit 3. An active layer 5 of p-$Ga_{0.9}Al_{0.1}As$, an upper clad layer 6 of n-$Ga_{0.6}Al_{0.4}As$ and a surface layer 7 of n-GaAs are epitaxially formed in order over the lower clad layer 4. An N-electrode 8 formed on the surface layer 7 is supplied with a negative potential to cause the diode to emit a laser beam. On the other hand, a P-electrode 9 on the opposite surface of the substrate 1 should be supplied with a positive potential. An emission area 10 in the active layer 5 just above the slit 3 emits light due to the combination of electrons and positive holes when the forward voltage is applied between the P-electrode 9 and the N-electrode 8.

FIG. 2 schematically shows an energy band profile as to electrons and holes in the lower clad layer 4, active layer 5 and upper clad layer 6 with a forward voltage between the P-electrode 9 and the N-electrode 8. Due to the compositional difference between the active layer of $Ga_{0.9}Al_{0.1}As$ and the clad layers of $Ga_{0.6}Al_{0.4}As$, the band gap in the active layer is smaller than that in the clad layers, as seen in FIG. 2. Therefore, electrons and holes are accumulated in the active layer, and then they readily combine with each other across the smaller band gap. Consequently, photons due to the combination of electrons and holes are emitted dominantly in the active layer.

Those photons are emitted in the emission area 10 of the active layer 5 just above the slit 3, since the injection current can flow only through the slit 3 and is obstructed in the other area by the constricting n-layer 2 interposed between the p-substrate 1 and the lower clad p-layer 4. Thus, the emission area 10 in the active layer 5 has a stripe geometry along the slit 3. Light waves thus locally generated should be further amplified, and the amplifying efficiency largely depends on efficiency of the optical confinement within the emission region 10 of the stripe geometry. The optical confinement may be achieved by a refractive index of the stripe region which is higher than that of the surrounding region.

In the instance shown in FIG. 1, light waves generated in the emission region 10 is confined within the active layer 5, since the refractive index in the active layer 5 of $Ga_{0.9}Al_{0.1}As$ is higher than that in the lower and upper cald layers 4, 6 of $Ga_{0.6}Al_{0.4}As$ due to the compositional difference. However, the light waves should be confined not only within the active layer 5 but also within the width of the stripe region 10.

When the lower clad layer 4 and the active layer 5 are thin enough, the effective refractive index of the active layer 5 can be controlled and lowered by the constricting layer 2 which is optically absorptive. In the active layer 5, therefore, the refractive index of the stripe region 10 just above the slit 3 is effectively higher than that of the other region accompanied by the absorptive layer 2. Consequently, the light waves are confined within and guided along the stripe region 10. Such control of the optical confinement within the width of the stripe region 10 will be discussed in more details below.

FIG. 3A is an enlarged fragmentary view in the vicinity of the slit 3 of the diode shown in FIG. 1, and FIG. 3C schematically shows distribution profiles of free electric charge in the active layer 5 in the vicinity of the slit 3 correspondingly to FIG. 3A. When the injection current is small, the density of free electric charge is somewhat raised in the stripe region 10 just above the slit 3 as shown by a chained line A in FIG. 3C. Consequently, a component of the refractive index which is inversely proportional to the density of electric charge is somewhat lowered in the stripe region 10 as shown by a chained line A in FIG. 3D. On the other hand, another component of the refractive index which is lowered by the optical absorptive effect of the constricting layer 2 is shown by a solid line A in FIG. 3E. The refractive index resulted from those two components is shown by a chained line A in FIG. 3F. As will be understood from the chained line A in FIG. 3F, the refractive index in the stripe region 10 (right hand side of a point $P_2$) is higher than that in the other region (left hand side of a point $P_1$), so that the optical waves are confined within the width of the stripe 10.

However, when the injection current is large, the density of free electric charge is considerably raised in the stripe region 10 as shown by a broken line B in FIG. 3C. Consequently, the component of the refractive index which is inversely proportional to the density of electric charge is considerably lowered in the stripe region 10 as shown by a broken line B in FIG. 3D. On the other hand, the influence of the optically absorptive layer 2 on the other component of the refractive index is left unchanged as shown by a solid line B in FIG. 3E which is the same as the line A. The refractive index resulting from those two components is shown by a broken line B in FIG. 3F. As will be seen from the broken line B in FIG. 3F, the refractive index in the stripe region 10 (right side of a point $Q_1$, including a point $Q_2$) is not much higher than that in the other region (left side of a point $Q_0$), so that it is difficult to completely confine the light waves within the width of the stripe 10.

SUMMARY OF THE INVENTION

In view of the above described deficiency in the prior art, it is a major object of the present invention to provide a stripe-type laser diode having an improved efficiency of the optical confinement.

A laser diode in accordance with the present invention comprises: a semiconductor substrate of a first conductivity type; a current constricting layer of a second conductivity type formed with a slit over said substrate, wherein said slit is opened through said constricting layer and separates said constricting layer into two areas; a liner(s) formed on at least both the inner side walls of said slit, wherein said liner(s) is of the same material as said constricting layer but of the first conductivity type; a lower clad layer of the first conductivity type formed over said constricting layer, burying said slit; an active layer of the first conductivity type which is formed over said lower clad and has a refractive index higher than that of said lower clad; and an upper clad layer of the second conductivity type which is formed over said active layer and has a refractive index lower than that of said active layer.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
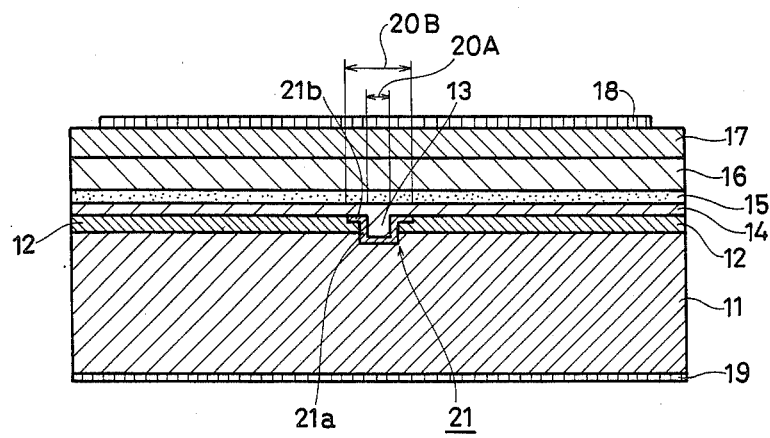
FIG. 4 is a sectional view of a stripe-type laser diode in accordance with the present invention.

Referring to FIG. 4, there is shown a sectional view of a stripe-type laser diode according to an embodiment of the present invention. Formed over a main surface of a p-GaAs substrate 11 is a current constricting n-GaAs layer 12 with a slit 13 for constricting electric current within the slit 13. the constricting layer is about 1.5 μm in thickness. The slit 13 is opened through the constricting layer 12 by anisotropic etching and thus the etched groove for the slit 13 separates the constricting layer 12 into two areas. The groove is about 3 μm in width at the bottom. A p-GaAs liner 21 is formed on the inner surface of the groove. The liner 21 has a pair of border portions 21b at a pair of upper edges of the groove. The border portions 21b extend 0.5–1.0 μm outward from the edges and flush with the upper surface of the constricting layer 12. A lower clad layer 14 of p-$Ga_{0.6}Al_{0.4}As$ is epitaxially formed over the constricting layer 2, burying the slit 3 and forming a upper flat surface. The lower clad layer 14 is about 0.25 μm in thickness. An active p-$Ga_{0.9}Al_{0.1}As$ layer 15 of about 0.08 μm thickness, an upper clad n-$Ga_{0.6}Al_{0.4}As$ layer 16 of about 1.5 μm thickness and a surface n-GaAs layer 17 of about 3.0 μm thickness are epitaxially formed in order over the lower clad layer 14. An N-electrode 18 of about 0.4 μm thickness formed on the surface layer 17 is supplied with a negative potential to cause the diode to emit a laser beam. On the other hand, a P-electrode 19 of about 0.4 μm thickness formed on the opposite surface of the substrate 11 should be supplied with a positive potential.

The injection current is constricted by the constricting layer 12 and may flow through an area 20B in the active layer 15. The current region 20B is just above the slit 13 and has a width corresponding to the distance between extremely outer edges of the border portions 21b of the liner 21. Most of photons due to the combination of electrons and holes are emitted in a central major portion 20A of the current region 20B, and the light waves thus generated are guided by the major region 20A itself. The guide region 20A has a width corresponding to the distance between a pair of inner surfaces of raised wall portions 21a of the liner 21. The optical confinement within the guide region 20A will be discussed in more details below.

Figure 1:
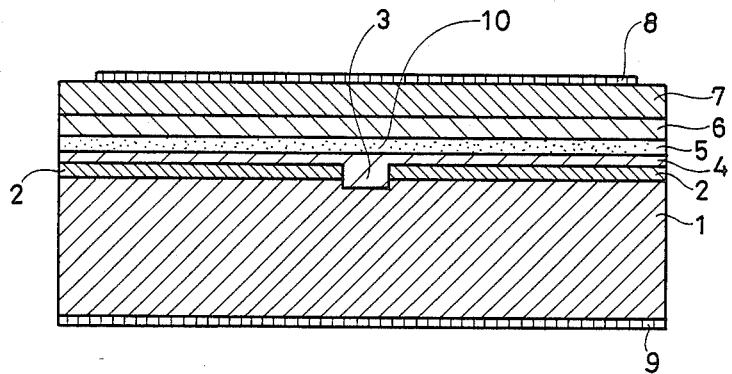
FIG. 1 is a sectional view of a conventional stripe-type laser diode.
Figure 2:
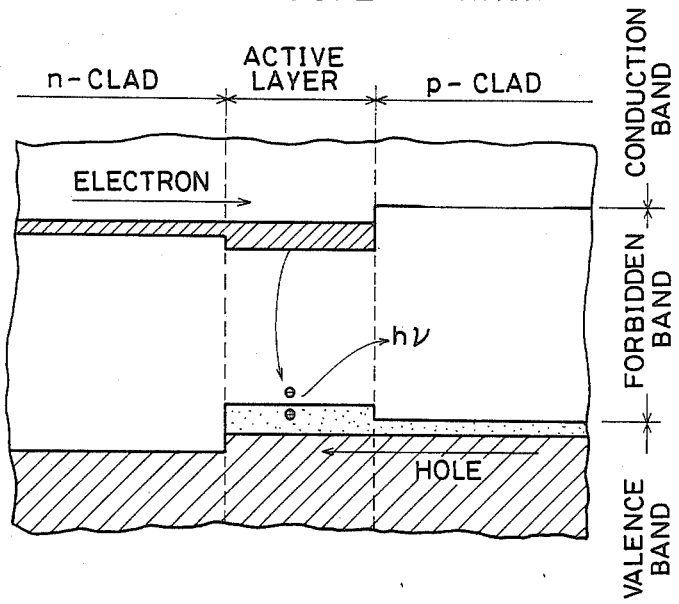
FIG. 2 shows an energy band profile in the laser diode of FIG. 1.
Figure 3A:
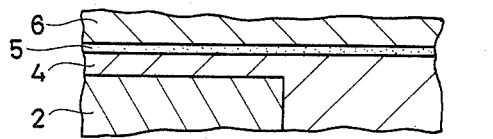
FIG. 3A is an enlarged fragmentary view in the vicinity of the slit 3 of the diode shown in FIG. 1.
Figure 3B:
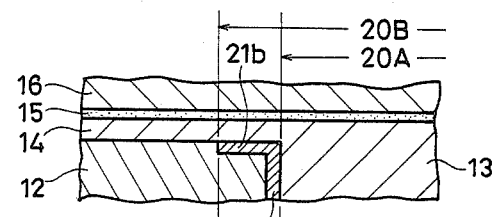
FIG. 3B is a similar fragmentary view of a diode of FIG. 4 in accordance with the present invention.
Figure 3C:
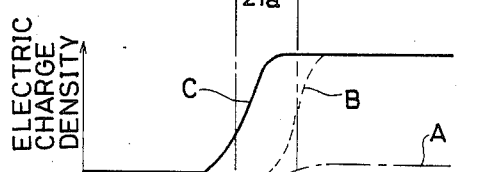
FIG. 3C shows distribution profiles of free electric charge, corresponding to FIGS. 3A and 3B.
Figure 3D:
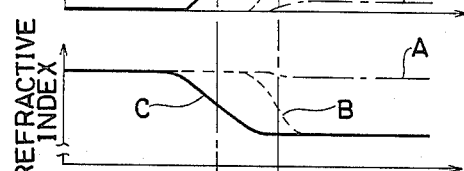
FIG. 3D illustrates changes in a component of the refractive index which is inversely proportional to the density of electric charge shown in FIG. 3C.
Figure 3E:
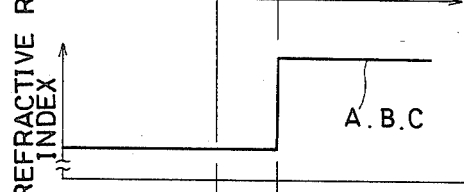
FIG. 3E illustrates a change in another component of the refractive index which is affected by the optically absorptive layer 2 shown in FIGS. 3A and 3B.
Figure 3F:
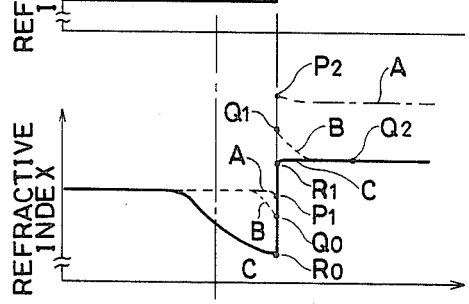
FIG. 3F shows the refractive index resulting from the above two components shown in FIGS. 3D and 3E.

Referring to FIG. 3B, although the constricting n-layer 12 obstructs the injection current, the p-liner 21 allows the current to flow through the liner itself. As shown by a solid line C in FIG. 3C, therefore, the high density region in the distribution profile of free electric charge becomes wider as compared with the conventional one shown by the broken line B. Further, the solid line C in FIG. 3C drops more moderately and has a longer trailing edge in comparison with the broken line B. The longer tail is caused by free electric charges dispersed through the border portion 21b of the liner 21. The component of the refractive index which is inversely proportional to the density of electric charge is shown by a solid line C in FIG. 3D. On the other hand, since the constricting layer 12 and the liner 21 both are of the same material GaAs except for the conductivity type and thus have the same optical absorption coefficient, the other component of the refractive index is the same as that in the conventional diode, as shown by a solid line C in FIG. 3E which is the same as the line B. A solid line C in FIG. 3F shows the refractive index resulting from those components shown by the lines C in FIG. 3D and 3E. As will be seen from the solid line C in FIG. 3F, the refractive index in the guide region 20A (right side of a point $R_1$) is much higher than that in the neighboring region (left side of a point $R_0$), so that the optical waves can be completely confined within the guide region 20A.

Figure 5:
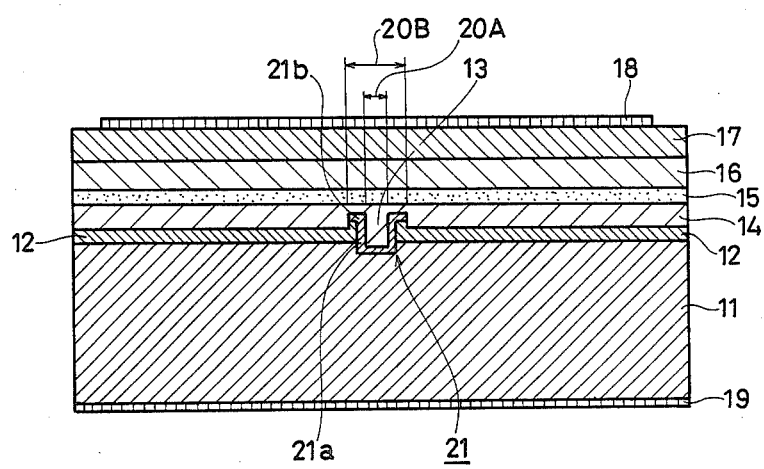
FIG. 5 is a sectional view of another stripe-type laser diode in accordance with the present invention.

Referring to FIG. 5, there is shown another embodiment in accordance with the present invention. In this diode, the border portions 21b of the liner 21 protrude upward from the upper surface of the constricting layer 12. This structure facilitates the formation of the liner 21, wherein firstly the liner 21 is formed not only on the inner surfaces of the groove for the slit 13 but also on the upper whole surface of the layer 12 and then areas of the liner 21 on the upper surface of the layer 12 are removed by etching except for the border portions 21b.

Although the liners 21 in the above described embodiments have their border portions, a liner which does not have its border portions also produce a significant improvement in the optical confinement. Further, it is not necessary that the raised walls of the groove for the slit 13 should be verticals. The walls may be inclined so that the groove will become wider at its upper level as compared with at its lower level. In this case, portions of the liner on the inclined walls may be thickened at the upper level as compared with at the lower level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a laser diode:
   a semiconductor substrate of a first conductivity type;
   a current constricting layer of a second conductivity type formed with a slit over said substrate, wherein said slit is opened through said constricting layer and separates said constricting layer into two areas;
   a liner formed on at least both the inner side walls of said slit, wherein said liner is of the same material as said constricting layer but of the first conductivity type;
   a lower clad layer of the first conductivity type formed over said constricting layer, burying said slit;
   an active layer of the first conductivity type which is formed over said lower clad layer and has a refractive index higher than that of said lower clad layer; and
   an upper clad layer of the second conductivity type which is formed over said active layer and has a refractive index lower than that of said active layer.

2. The laser diode in accordance with claim 1, wherein said liner further has a pair of border portions extending outward from the upper edges of said slit.

3. The laser diode in accordance with claim 1, wherein said constricting layer and said liner both are formed of GaAs.

4. The laser diode in accordance with claim 2, wherein said constricting layer and said liner both are formed of GaAs.

5. The laser diode in accordance with claim 3, wherein said lower and upper clad layers both are formed of $Ga_{0.6}Al_{0.4}As$, and said active layer is formed of $Ga_{0.9}Al_{0.1}As$.

6. The laser diode in accordance with claim 4, wherein said lower and upper clad layers both are formed of $Ga_{0.6}Al_{0.4}As$, and said active layer is formed of $Ga_{0.9}Al_{0.1}As$.

7. The laser diode in accordance with claim 2, wherein said border portions of said liner flush with the upper surface of said constricting layer.

8. The laser diode in accordance with claim 2, wherein said border portions of said liner protrude upward from the upper surface of said constricting layer.

* * * * *